(12) United States Patent
Horzella et al.

(10) Patent No.: US 11,849,544 B2
(45) Date of Patent: Dec. 19, 2023

(54) MILLING OF FLEX FOIL WITH TWO CONDUCTIVE LAYERS FROM BOTH SIDES

(71) Applicant: Gentherm Inc., Northville, MI (US)

(72) Inventors: Jan Horzella, Balgheim (DE); Fritz Jung, Fuchstal (DE)

(73) Assignee: Gentherm GmbH, Odelzhausen (DE)

( * ) Notice: Subject to any disclaimer, the term of this patent is extended or adjusted under 35 U.S.C. 154(b) by 774 days.

(21) Appl. No.: 16/918,474

(22) Filed: Jul. 1, 2020

(65) Prior Publication Data
US 2020/0337154 A1    Oct. 22, 2020

Related U.S. Application Data

(63) Continuation of application No. 16/389,277, filed on Apr. 19, 2019, now Pat. No. 10,709,022.

(51) Int. Cl.
| | | |
|---|---|---|
| B02C 23/00 | (2006.01) | |
| B02C 23/14 | (2006.01) | |
| B02C 23/38 | (2006.01) | |
| H05K 1/02 | (2006.01) | |
| H05K 3/04 | (2006.01) | |
| H05K 3/00 | (2006.01) | |

(52) U.S. Cl.
CPC ............. *H05K 3/043* (2013.01); *B02C 23/00* (2013.01); *B02C 23/14* (2013.01); *B02C 23/38* (2013.01); *H05K 1/028* (2013.01); *H05K 3/0044* (2013.01); *H05K 2203/0143* (2013.01); *H05K 2203/0228* (2013.01)

(58) Field of Classification Search
None
See application file for complete search history.

(56) References Cited

U.S. PATENT DOCUMENTS

| | | | | |
|---|---|---|---|---|
| 7,919,027 | B2* | 4/2011 | Nordlinder | H05K 3/045 |
| | | | | 174/254 |
| 10,667,394 | B1* | 5/2020 | Ciaccio | H01P 11/00 |
| 10,709,022 | B1* | 7/2020 | Horzella | H05K 3/04 |

FOREIGN PATENT DOCUMENTS

| | | | | |
|---|---|---|---|---|
| DE | 102017001424 A1 * | 8/2018 | | G08B 13/244 |
| WO | WO-2005027599 A1 | 3/2005 | | |
| WO | WO-2019068826 A1 * | 4/2019 | | H05K 1/0278 |

OTHER PUBLICATIONS

WO-2019068826-A1 (translation) (Year: 2023).*

(Continued)

*Primary Examiner* — Hoa C Nguyen
*Assistant Examiner* — John B Freal

(57) ABSTRACT

A method for milling flex foil includes providing a web of flex foil including a substrate; a first conductive layer arranged on one surface of the substrate; a second conductive layer arranged on an opposite surface of the substrate; a first insulating layer arranged adjacent to the first conductive layer; and a second insulating layer arranged adjacent to the second conductive layer. The method includes dry milling one side of the web using a first cliché pattern including raised portions and non-raised portions to selectively remove at least one of the first conductive layer and the first insulating layer. The method includes dry milling an opposite side of the web using a second cliché pattern including upper raised portions, lower raised portions and non-raised portions to selectively remove the second insulating layer.

16 Claims, 5 Drawing Sheets

(56) References Cited

OTHER PUBLICATIONS

DE-102017001424-A1 (translation) (Year: 2023).*
International Search Report and Written Opinion dated Jun. 29, 2020 corresponding to International Application No. PCT/US2020/026630, 14 pages.

* cited by examiner

MILLING OF FLEX FOIL WITH TWO CONDUCTIVE LAYERS FROM BOTH SIDES

CROSS-REFERENCE TO RELATED APPLICATIONS

The present disclosure is a continuation of U.S. patent application Ser. No. 16/389,277 filed on Apr. 19, 2019. The entire disclosure of the application referenced above is incorporated herein by reference.

FIELD

The present disclosure relates to wiring of electrical components, and more particularly to milling of flex foil with two conductive layers from both sides.

BACKGROUND

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

Wiring harnesses are used to connect electrical components in various applications. When a significant number of components need to be connected in a given location, a plurality of wires, printed circuit boards (PCBs) and/or flexible substrates with conductive traces may be used. Typically, the flexible substrates include a single conductive layer and outer insulating layers (referred to herein as flexible foil or flex foil). The single conductive layer may be patterned to define traces, fingers and other structures that can be used to provide multiple connections.

SUMMARY

A method for milling flex foil includes providing a web of flex foil including a substrate; a first conductive layer arranged on one surface of the substrate; a second conductive layer arranged on an opposite surface of the substrate; a first insulating layer arranged adjacent to the first conductive layer; and a second insulating layer arranged adjacent to the second conductive layer. The method includes dry milling one side of the web using a first cliché pattern including raised portions and non-raised portions to selectively remove at least one of the first conductive layer and the first insulating layer. The method includes dry milling an opposite side of the web using a second cliché pattern including upper raised portions, lower raised portions and non-raised portions to selectively remove the second insulating layer.

In other features, the first cliché pattern removes the at least one of the first insulating layer and the first conductive layer adjacent to the raised portions and does not remove the first insulating layer and the first conductive layer adjacent to the non-raised portions. The upper raised portions of the second cliché pattern remove the second insulating layer on the opposite side of the web at locations where the at least one of the first insulating layer and the first conductive layer are removed. The lower raised portions of the second cliché pattern remove the second insulating layer on the opposite side of the web at locations where the at least one of the first insulating layer and the first conductive layer are not removed. The non-raised portions of the second cliché pattern do not remove the second insulating layer.

In other features, the method includes feeding the web between a first milling wheel, arranged on the one side of the web, and a first cliché arranged on the opposite side of the web, wherein the first cliché includes the first cliché pattern. The method includes feeding the web between a second milling wheel, arranged on the opposite side of the web, and a second cliché located on the one side of the web, wherein the second cliché includes the second cliché pattern.

In other features, the method includes feeding the web between a first milling wheel, arranged on the one side of the web, and a first cliché arranged on the opposite side of the web, wherein the first cliché includes the first cliché pattern; changing the first cliché pattern on the first cliché to the second cliché pattern; inverting and aligning the web; and feeding the web between the first milling wheel and the first cliché.

In other features, the first conductive layer and the second conductive layer have a thickness in a range from 5 µm to 40 µm.

A flex foil includes a substrate; a first conductive layer arranged on one surface of the substrate; a second conductive layer arranged on an opposite surface of the substrate; a first insulating layer arranged adjacent to the first conductive layer; and a second insulating layer arranged adjacent to the second conductive layer. One side of the flex foil is dry milled using a first cliché pattern including raised portions and non-raised portions to selectively remove at least one of the first conductive layer and the first insulating layer. An opposite side of the flex foil is dry milled using a second cliché pattern including upper raised portions, lower raised portions and non-raised portions to selectively remove the second insulating layer.

In other features, the first cliché pattern removes at least one of the first insulating layer and the first conductive layer adjacent to the raised portions and does not remove the first insulating layer and the first conductive layer adjacent to the non-raised portions. The upper raised portions of the second cliché pattern remove the second insulating layer on the opposite side of the flex foil at locations where the at least one of the first insulating layer and the first conductive layer are removed. The lower raised portions of the second cliché pattern remove the second insulating layer on the opposite side of the flex foil at locations where the at least one of the first insulating layer and the first conductive layer are not removed. The non-raised portions of the second cliché pattern do not remove the second insulating layer.

In other features, the flex foil is fed between a first milling wheel, arranged on the one side of the flex foil, and a first cliché arranged on the opposite side of the flex foil, wherein the first cliché includes the first cliché pattern. The flex foil is fed between a second milling wheel, arranged on the opposite side of the flex foil, and a second cliché arranged on the one side of the flex foil, wherein the second cliché includes the second cliché pattern.

In other features, the flex foil is fed between a first milling wheel, arranged on the one side of the flex foil, and a first cliché arranged on the opposite side of the flex foil, wherein the first cliché includes the first cliché pattern. The first cliché pattern on the first cliché is changed to the second cliché pattern. The flex foil is inverted and aligned. The flex foil is fed between the first milling wheel and the first cliché.

In other features, the first conductive layer and the second conductive layer have a thickness in a range from 5 µm to 40 µm.

A flex foil includes a substrate; a first conductive layer arranged on one surface of the substrate; a second conductive layer arranged on an opposite surface of the substrate;

a first insulating layer arranged adjacent to the first conductive layer; and a second insulating layer arranged adjacent to the second conductive layer. A first portion of the first insulating layer and the first conductive layer are milled to the one surface of the substrate at a first location. A first portion of the second insulating layer is milled on an opposite surface of the substrate at the first location.

In other features, the first conductive layer and the second conductive layer have a thickness in a range from 5 µm to 40 µm.

In other features, a second portion of the first insulating layer and the first conductive layer are not milled on the one surface of the substrate at a second location, and a second portion of the second insulating layer is milled on the opposite surface of the substrate at the second location.

In other features, a third portion of the first insulating layer and the first conductive layer is milled to the one surface of the substrate at a third location. A third portion of the second insulating layer is not milled on the opposite surface of the substrate at the third location.

In other features, a fourth portion of the first insulating layer and the first conductive layer are not milled on the one surface of the substrate at a fourth location. A fourth portion of the second insulating layer is not milled on the opposite surface of the substrate at the fourth location.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1A:
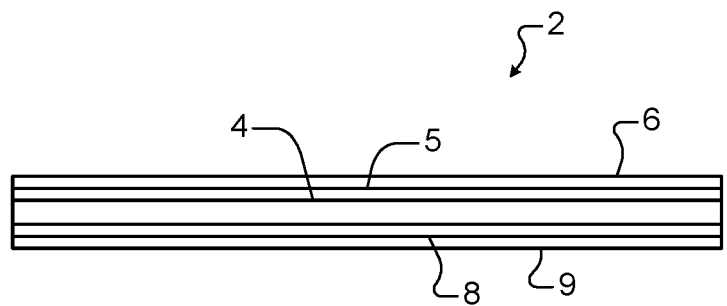
FIG. 1A is a side cross-sectional view of an example of a flex foil including two conductive layers before milling according to the present disclosure.

Typically, the flexible substrates (collectively referred to herein as flexible foil or flex foil) include a single conductive layer and first and second outer insulating layers. The single conductive layer may be patterned using photolithography or dry milled to define traces, fingers and other structures that can be used to provide multiple connections. In some situations, a higher density of traces and connections need to be provided.

An additional conductive layer can be added to the flex foil. However, traditional dry milling approaches generally cannot be used to pattern the flex foil from both sides. A first pattern is milled from one side into the first conductive layer. A second pattern is used for an opposite side of the flex foil. However, the first pattern causes variations in the thickness of the flex foil and spacing between the milling wheel and the cliché during milling using the second pattern.

For example, a dry milling process for a flex foil including a single conductive layer is shown and described in U.S. Pat. No. 7,919,027, issued on Apr. 5, 2011 and entitled "Methods and Devices for Manufacturing of Electrical Components and Laminated Structures", which is hereby incorporated herein by reference in its entirety. During dry milling, a web of a flex foil including a single conducting layer and an insulating layer is fed between a cliché and a milling wheel. The cliché includes a pattern including raised portions and non-raised portions.

In some examples, the pattern is defined on a thin, flexible substrate using photolithography and the flexible substrate is attached to an outer surface of a rotating drum. The milling wheel is arranged on an opposite side of the web. The raised portions of the pattern on the cliché push the web into the milling wheel and the corresponding portions of the conductive layer and/or outer insulating layer are removed. The portions of the conductive layer that remain are thereby patterned to provide traces, pads for fingers, etc. After milling, an insulating layer or covering layer (or coverlay) can be added over the patterned conductive layer and an additional milling step can be performed.

As can be appreciated, however, the process cannot simply be repeated on the opposite side to pattern a second conductive layer of the flex foil. The removed material of the first conductive layer will cause problems when patterning the second pattern using the same approach as described above.

The dry milling systems and methods according to the present disclosure relate to milling of flex foil having two conductive layers from both sides. The first conductive layer and/or the insulating layer are milled as described above using a first pattern having raised portions (corresponding to locations where material is removed) and non-raised potions (corresponding to locations where material is not removed).

After milling the first conductive layer and/or the insulating layer, the web is inverted or rotated 180° and a second pattern is used to mill the opposite side of the flex foil. The second pattern includes upper raised portions (corresponding to locations where material is removed from both sides of the web), lower raised portions (corresponding to locations where material is removed during the second milling step but not the first milling step), and non-raised portions (corresponding to locations where material is not removed).

In some examples, the conductive layers are made of metal such as Al or Cu and have a thickness in a range from 5 µm to 40 µm, although other metals or thicker or thinner layers can be used. For example only, Cu having a thickness of 9 µm, 18 µm, or 35 µm, or Al having a thickness of 9 µm or 18 µm may be used. In some examples, the insulating layers and/or the substrate include film such as polyethylene terephthalate (PET), polyethylene naphthalate (PEN), or polyimide (PI), although other substrate or insulating materials can be used.

Figure 1B:
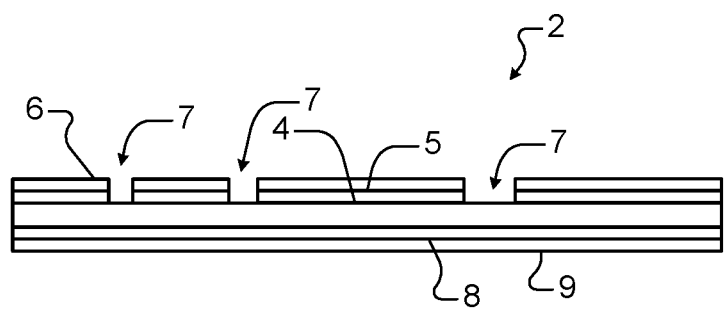
FIG. 1B is a side cross-sectional view of an example of the flex foil including two conductive layers after milling one side of the flex foil according to the present disclosure.
Figure 1C:
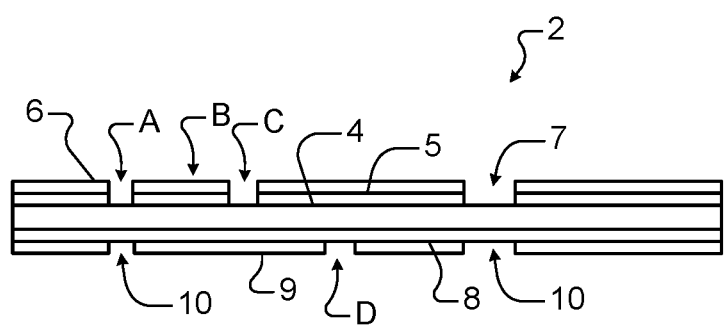
FIG. 1C is a side cross-sectional view of an example of the flex foil including two conductive layers after milling both sides of the flex foil according to the present disclosure.

Referring now to FIGS. 1A to 1C, milling of a flex foil 2 from both sides is shown. In FIG. 1A, the flex foil 2 is shown prior to milling. The flex foil 2 includes a substrate 4, a first conductive layer 5 arranged on one side of the substrate 4, and a first insulating layer 6 arranged on the first conductive layer 5. The flex foil 2 further includes a second conductive layer 8 arranged on an opposite side of the substrate 4 and a second insulating layer 9 arranged on the second conductive layer 8. In FIG. 1B, a first cliché pattern is used to mill the first conductive layer 5 and the first insulating layer 6 as shown at one or more locations identified at 7. In FIG. 1C, a second cliché pattern is used to selectively mill the second insulating layer 9 at one or more locations identified at 10.

Figure 2A:
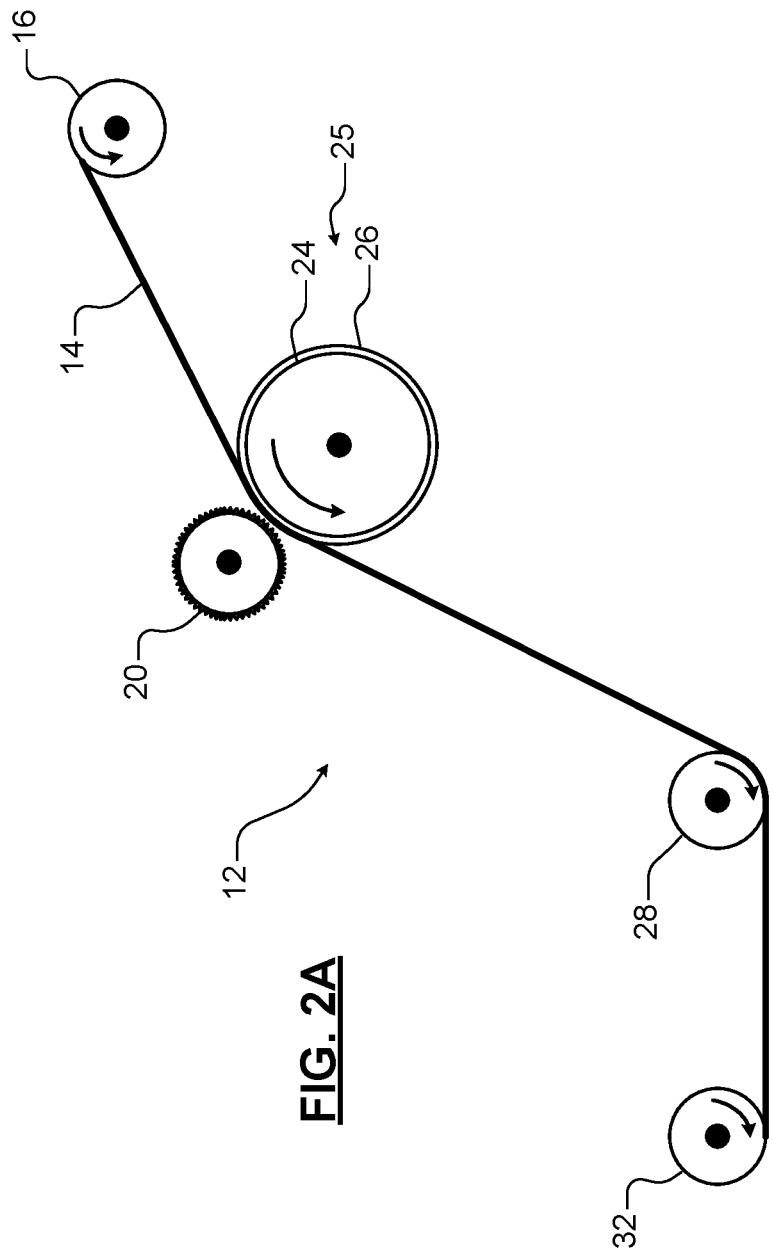
FIG. 2A is a side view of an example of a milling system for milling a flex foil including two conductive layers from both sides according to the present disclosure.

Referring now to FIG. 2A, a milling system 12 for milling a web 14 of the flex foil 2 is shown. A first roll 16 supplies the web 14 of the flex foil 2. The web 14 is fed between the milling wheel 20 and a cliché 25. In some examples, the cliché 25 includes a rotating drum 24. A flexible substrate 26 defining a first pattern or a second pattern is attached to the rotating drum 24. Alternately, the first or second pattern can be made directly on the rotating drum 24. In some examples, the first pattern or the second pattern is defined on the flexible substrate 26 or the rotating drum 24 using photolithography techniques, although other techniques can be used.

The milling wheel 20 is arranged within a predetermined distance of the rotating drum 26 to allow milling of raised portions of the web 14 as the web passes through. The milling wheel 20 includes teeth that cut portions of the web 14 that are raised by corresponding raised portions of the first pattern. The web 14 is fed around a second drum 28 to a roll 32.

The first conductive layer 5 and/or the first insulating layer 6 are milled as described above using the first pattern. The raised portions of the first pattern correspond to locations where the first conductive layer 5 and/or the first insulating layer 6 are removed. The first pattern includes non-raised potions corresponding to locations where material is not removed.

After the first milling operation, the web is rotated 180° and the first pattern is replaced by a second pattern. Alternately, a second cliché can be used as will be shown in FIG. 2B. The second pattern includes upper raised portions (corresponding to locations where material is removed from both surfaces of the web 14), lower raised portions (corresponding to locations where material is removed from the side corresponding to the second conducting layer but not from the side corresponding to the first conducting layer), and non-raised portions (corresponding to locations where material is not removed from the side corresponding to the second conducting layer).

Figure 2B:
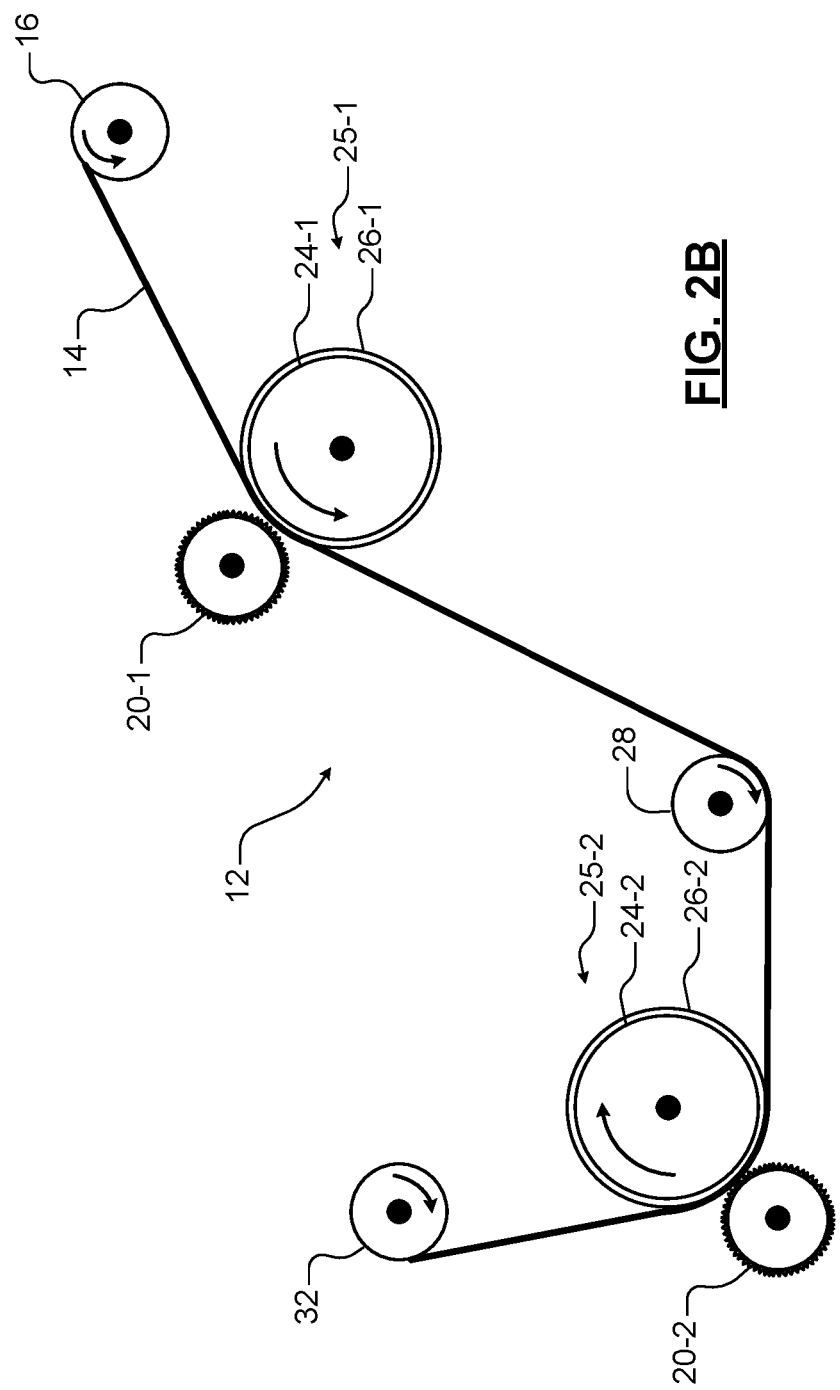
FIG. 2B is a side view of an example of another milling system for milling a flex foil including two conductive layers from both sides according to the present disclosure.

In FIG. 2B, the milling system 12 includes a first cliché 25-1 (including a rotating drum 24-1 and a flexible substrate 26-1) arranged adjacent to a first milling wheel 20-1 and a second cliché 25-2 (including a rotating drum 24-2 and a flexible substrate 26-2) arranged adjacent to a second milling wheel 20-2. The first cliché 25-1 is arranged on one side of the web 14 and the second cliché 25-2 is arranged on an opposite side of the web 14. The first cliché 25-1 mills the first pattern on the one side. The second cliché 25-2 mills the second pattern on the opposite side. After the milling is performed, additional operations can be performed. For example, a cutting operation can be performed to separate individual flex foils from the web 14.

Figure 3A:
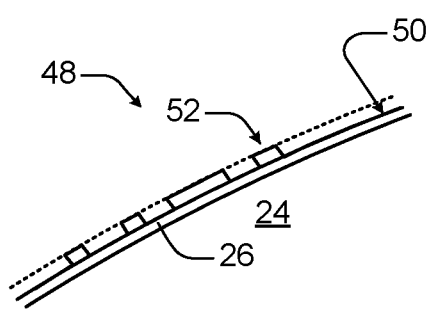
FIG. 3A is a side view of a portion of a first cliché pattern used to mill a first side of the flex foil according to the present disclosure.

Referring now to FIG. 3A, a surface of the substrate 26 defines a portion of a first pattern 48 that is used to mill one side of the web 14. The first pattern 48 includes non-raised portions 50 (where no milling of the web 14 occurs) and raised portions 52 (where the insulating material and/or the first conductive layer are removed from the one side of the web 14).

Figure 3B:
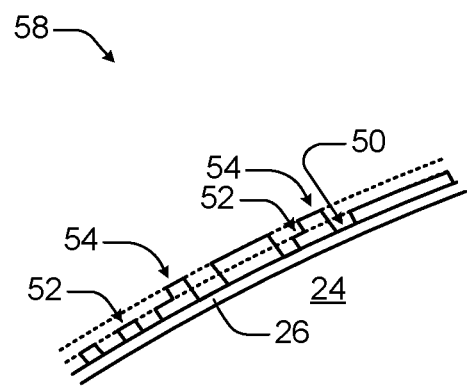
FIG. 3B is a side view of a portion of a second cliché pattern used to mill a second side of the flex foil after the first side is milled according to the present disclosure.

Referring now to FIG. 3B, a surface of the substrate 26 defines a second pattern 58 that is used to mill an opposite side of the web 14. The second pattern 58 includes upper raised portions 54 (corresponding to locations where material is removed from both sides of the web 14). The second pattern 58 includes lower raised portions 52 (corresponding to locations where material is removed from the side of the web 14 adjacent to the second conductive layer but not from the side adjacent to the first conductive layer). The second pattern 58 includes non-raised portions 50 (corresponding to locations where material is not removed from the second conductive layer).

Referring back to FIG. 1C, in locations A, milling is performed on both sides of the flex foil 2. A corresponding portion of the first pattern for the location A will have raised portions (to remove the insulating layer and/or the first conductive layer). A corresponding portion of the second pattern will have the upper raised portions to offset the material removed by the first pattern and to mill the second insulating layer. In locations B, no milling from either side will occur. Corresponding portions of both the first and second patterns will have non-raised portions.

In locations C, corresponding portions of the first pattern will have raised portions to remove the first conductive layer and/or the insulating layer. Corresponding portions of the second pattern will have non-raised portions since the second insulating layer is not removed.

In locations D, corresponding portions of the first pattern will have non-raised portions so that material is not removed. Corresponding portions of the second pattern will have lower raised portions to remove the second insulating layer.

Figure 4:
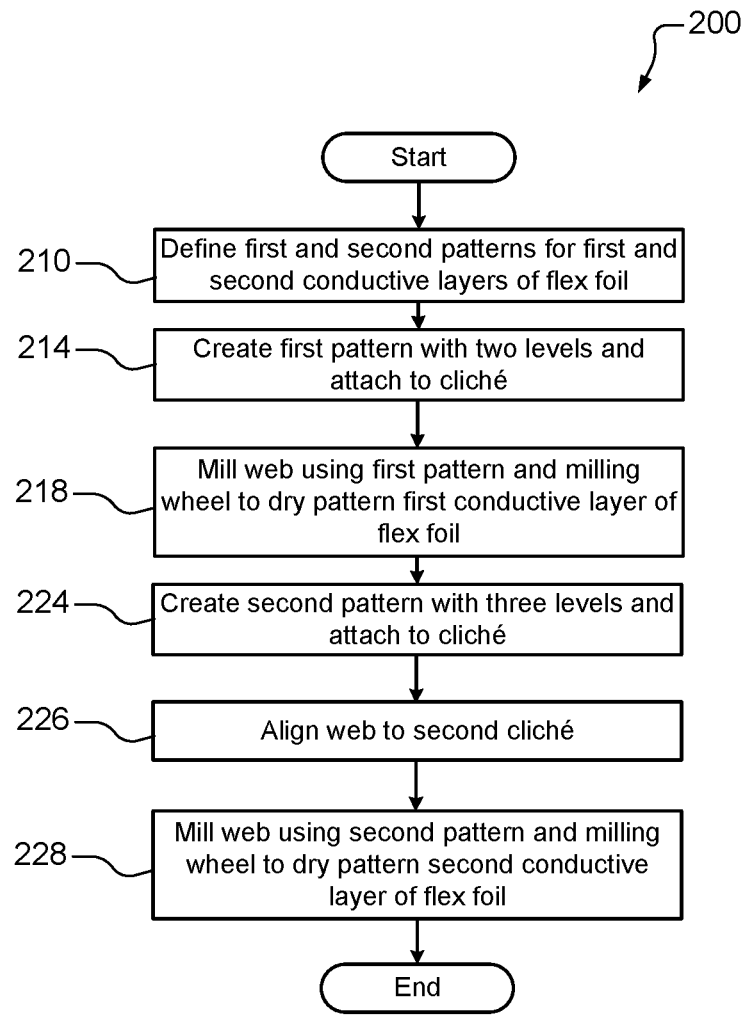
FIG. 4 is a flowchart of an example of a method for milling the flex foil with two conductive layers according to the present disclosure.

Referring now to FIG. 4, a method 200 for milling the flex foil/web from both sides is shown. At 210, first and second patterns for first and second conductive layers of the flex foil are defined based on a desired layout. At 214, a first pattern is created on a substrate or a drum to define raised and non-raised portions. If the substrate is used, the substrate is attached to the cliché. At 218, the web/flex foil is milled using the first pattern on the cliché and the milling wheel to dry pattern one side of the web/flex foil.

At 224, a second pattern is created on a substrate or a drum to define upper raised portions, lower raised portions and non-raised portions. If the substrate is used, the substrate with the first pattern is removed and the second pattern is attached to the cliché. Alternately, a second cliché is used as shown in FIG. 2B. At 276, the web including the flex foil is optionally inverted and aligned to the second cliché pattern. The web is milled using the second cliché pattern and the milling wheel to dry pattern an opposite side of the web/flex foil.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A flex foil, comprising:
   a substrate;
   a first conductive layer arranged on one surface of the substrate;
   a second conductive layer arranged on an opposite surface of the substrate;
   a first insulating layer arranged adjacent to the first conductive layer; and
   a second insulating layer arranged adjacent to the second conductive layer,
   wherein one side of the flex foil is dry milled using a first cliché pattern including raised portions and non-raised portions to selectively remove only the first conductive layer and the first insulating layer, and
   wherein an opposite side of the flex foil is dry milled using a second cliché pattern including upper raised portions, lower raised portions and non-raised portions to selectively remove only the second insulating layer.

2. The flex foil of claim 1, wherein the first cliché pattern removes only the first insulating layer and the first conductive layer adjacent to the raised portions and does not remove the first insulating layer and the first conductive layer adjacent to the non-raised portions.

3. The flex foil of claim 1, wherein the upper raised portions of the second cliché pattern remove the second insulating layer on the opposite side of the flex foil at locations where only the first insulating layer and the first conductive layer are removed.

4. A flex foil comprising:
   a substrate;
   a first conductive layer arranged on one surface of the substrate;
   a second conductive layer arranged on an opposite surface of the substrate;
   a first insulating layer arranged adjacent to the first conductive layer; and
   a second insulating layer arranged adjacent to the second conductive layer,
   wherein one side of the flex foil is dry milled using a first cliché pattern including raised portions and non-raised portions to selectively remove at least one of the first conductive layer and the first insulating layer, and
   wherein an opposite side of the flex foil is dry milled using a second cliché pattern including upper raised portions, lower raised portions and non-raised portions to selectively remove only the second insulating layer,
   wherein the upper raised portions of the second cliché pattern remove the second insulating layer on the opposite side of the flex foil at locations where the at least one of the first insulating layer and the first conductive layer are removed, and
   wherein the lower raised portions of the second cliché pattern remove the second insulating layer on the opposite side of the flex foil at locations where the at least one of the first insulating layer and the first conductive layer are not removed.

5. The flex foil of claim 4, wherein the non-raised portions of the second cliché pattern do not remove the second insulating layer.

6. The flex foil of claim 1, wherein:
   the flex foil is fed between a first milling wheel, arranged on the one side of the flex foil, and a first cliché arranged on the opposite side of the flex foil, wherein the first cliché includes the first cliché pattern; and
   the flex foil is fed between a second milling wheel, arranged on the opposite side of the flex foil, and a second cliché arranged on the one side of the flex foil, wherein the second cliché includes the second cliché pattern.

7. The flex foil of claim 1, further comprising:
   the flex foil is fed between a first milling wheel, arranged on the one side of the flex foil, and a first cliché arranged on the opposite side of the flex foil, wherein the first cliché includes the first cliché pattern;
   the first cliché pattern on the first cliché is changed to the second cliché pattern;
   the flex foil is inverted and aligned; and
   the flex foil is fed between the first milling wheel and the first cliché.

8. The flex foil of claim 1, wherein the first conductive layer and the second conductive layer have a thickness in a range from 5 µm to 40 µm.

9. A flex foil, comprising:
   a substrate;
   a first conductive layer arranged on one surface of the substrate;
   a second conductive layer arranged on an opposite surface of the substrate;
   a first insulating layer arranged adjacent to the first conductive layer; and
   a second insulating layer arranged adjacent to the second conductive layer, wherein a first portion of the first insulating layer and the first conductive layer are milled to the one surface of the substrate at a first location, wherein a first portion of the second insulating layer is milled on the opposite surface of the substrate at the first location, a second portion of the first insulating layer and the first conductive layer are not milled on the one surface of the substrate at a second location, and a second portion of the second insulating layer is milled on the opposite surface of the substrate at the second location.

10. The flex foil of claim 9, wherein the first conductive layer and the second conductive layer have a thickness in a range from 5 µm to 40 µm.

11. The flex foil of claim 9, wherein:

a third portion of the first insulating layer and the first conductive layer is milled to the one surface of the substrate at a third location, and a third portion of the second insulating layer is not milled on the opposite surface of the substrate at the third location.

12. The flex foil of claim 9, wherein:

a fourth portion of the first insulating layer and the first conductive layer are not milled on the one surface of the substrate at a fourth location, and a fourth portion of the second insulating layer is not milled on the opposite surface of the substrate at the fourth location.

13. The flex foil of claim 1, wherein the upper raised portions of the second cliché pattern remove the second insulating layer on the opposite side of the flex foil at locations where only the first insulating layer and the first conductive layer are removed.

14. The flex foil of claim 13, wherein the lower raised portions of the second cliché pattern remove the second insulating layer on the opposite side of the flex foil at locations where only the first insulating layer and the first conductive layer are not removed.

15. The flex foil of claim 14, wherein the non-raised portions of the second cliché pattern do not remove the second insulating layer.

16. The flex foil of claim 4, wherein the first conductive layer and the second conductive layer have a thickness in a range from 5 µm to 40 µm.

* * * * *